United States Patent [19]

Vary

[11] Patent Number: 4,766,562
[45] Date of Patent: Aug. 23, 1988

[54] DIGITAL ANALYZING AND SYNTHESIZING FILTER BANK WITH MAXIMUM SAMPLING RATE REDUCTION

[75] Inventor: Peter Vary, Herzogenaurach, Fed. Rep. of Germany

[73] Assignee: U.S. Philips Corp., New York, N.Y.

[21] Appl. No.: 843,331

[22] Filed: Mar. 24, 1986

[30] Foreign Application Priority Data

Mar. 23, 1985 [DE] Fed. Rep. of Germany ....... 3510573

[51] Int. Cl.$^4$ ............................................... G06F 7/38
[52] U.S. Cl. ................................................... 364/724
[58] Field of Search ................... 364/723, 724; 381/31

[56] References Cited

U.S. PATENT DOCUMENTS

| | | | |
|---|---|---|---|
| 4,589,130 | 5/1986 | Galand | 381/31 |
| 4,622,680 | 11/1986 | Zinser | 381/31 |
| 4,623,980 | 11/1986 | Vary | 364/724 |
| 4,691,292 | 9/1987 | Rothweiler | 364/724 |

OTHER PUBLICATIONS

Esteban et al., "HQMF: Halfband Quadrature Mirror Filters", Proceedings of the 1981 IEEE International Conference on Acoustics, Speech and Signal Processing, ICASSP 81, pp. 220-223.

Bellanger et al., "Digital Filtering by Polyphase Network: Application to Sample-Rate Alteration and Filter Banks", IEEE Trans. on Acoustics, Speech, and Signal Processing, vol. ASSP-24, No. 2, Apr. 1976, pp. 109-114.

Primary Examiner—Gary V. Harkcom
Assistant Examiner—Long Thanh Nguyen
Attorney, Agent, or Firm—Thomas A. Briody; Leroy Eason

[57] ABSTRACT

A digital analyzing and synthesizing filter bank in which a digital polyphase network in the analyzing filter bank provides sampling rate reduction by dividing an input signal into M complex sub-band signals, and the sub-band signals are subjected to a further staggered sampling rate reduction of the real and imaginary components thereof. This achieves maximum sampling reduction while permitting aliasing distortions to be compensated in the synthesizing filter bank.

4 Claims, 2 Drawing Sheets

DIGITAL ANALYZING AND SYNTHESIZING FILTER BANK WITH MAXIMUM SAMPLING RATE REDUCTION

BACKGROUND OF THE INVENTION

1. Field of the Invention

The invention relates to digital analysing and synthesizing filter banks.

2. Description of the Related Art

Digital filter banks can be used for spectrally dividing an incoming digital input signal into sub-band signals, more specifically during the transmission, storage and processing of the signals. Depending on the application, the sub-band signals thus produced are encoded and/or processed. Because of the reduced bandwidth of the digital sub-band signals produced by means of a digital filter bank, the sub-band signals can be represented by samples having a reduced sampling rate in accordance with the conventional sampling theorem. As a result, both the computational cost and efforts for the analysing filter bank and the cost and efforts for the transmission, storage or other processing of the sub-band signals can be reduced correspondingly.

Because of the sampling rate reduction effected in the analysing filter bank it is necessary for the reconstruction or synthesis of an output signal from the processed sub-band signals to increase the sampling rate in a synthesizing filter bank. By increasing the sampling frequency to the original value an interpolation of the sub-band signals is effected and the interpolated sub-band signals thus obtained are additively combined to produce the output signal.

As mentioned already in the foregoing, in order to reduce the cost and efforts, particularly in the transmission and storage of signals, it is necessary to effect a maximum sampling rate reduction. The maximum sampling rate reduction is obtained in accordance with the sampling theorem from the bandwidth of the sub-band signals. For the assumed case of a digital filter bank having channels of a constant bandwidth Fa/M, Fa designating the sampling rate of the input signals and M the number of the channels, the sampling rate can be reduced by a factor $r=M/2$ for real band filters or, when it is assumed that the band filters are ideal filters, it can be reduced by a factor $r=M$ for complex band filters. Because of the finite edge steepness of real filters, however, the above-mentioned maximum sampling rate reduction cannot be realised.

The book "Multirate Digital Signal Processing" by Ronald E. Crochiere, Prentice-Hall, Inc., Englewood Cliffs, N.J. 07632, more specifically pages 376 to 382, discloses for the special case $M=2$ and $r=2$ a solution, known as quadrature mirror filtering (QMF), in which the occurring spectral folding (aliasing) components are compensated for in the synthesizing filter bank. By interconnecting a total of $(M-1)$ two-channel filter banks to form a tree structure, a maximum sampling rate reduction can also be effected for an M-channel filter bank (cf. page 379).

The M-channel filter bank thus obtained has the disadvantage that on the one hand a comparatively high cost and effort is required for the in total $2(M-1)$ filters, and on the other hand, that the cascade arrangement of $\log_2 (M)$ sub-filters in each tree branch involves a large signal delay.

For filter banks having a number of channels $M>2$ which do not operate with a maximum sampling rate reduction, a polyphase filter bank is often used which, as compared with the above-mentioned tree structure, requires a lower circuit cost and design effort. The published German patent application DE-OS 31 18 473, corresponding to U.S. Pat. No. 4,623,980, discloses a multi-channel filter bank which is constituted by the combination of a digital polyphase network with a processor performing a discrete Fourier transform (DFT). This filter bank has a significantly shorter signal delay as compared with the filter bank having a tree structure and, in addition, the circuit cost and design effort is less.

However, in the case in which a maximum sampling rate reduction is effected, aliasing distortions occur in the above-mentioned filter bank which are not compensated for in the synthesizing filter bank.

SUMMARY OF THE INVENTION

The invention has for its object to implement a digital analysing and synthesizing filter bank of the type known from said published German patent application DE-OS 31 18 473 such that also for the case of a maximum sampling rate reduction the disturbing aliasing distortions are compensated for.

The digital analysing and synthesizing filter bank according to the invention provides a modified two-stage sampling rate reduction, as a result of which complex polyphase filter banks with maximum sampling rate reduction can be realized. The disturbing aliasing components then occurring can be compensated for in a simple way during the synthesizing filtering operation.

An embodiment of the invention has the advantage that the symmetry properties of the DFT can be utilized. Using a single DFT-transform the cosine and sine transforms of two different input vectors can be computed simultaneously.

A further embodiment has the advantage that the transform length is reduced to M/2.

BRIEF DESCRIPTION OF THE DRAWINGS

The invention will now be described in greater detail with reference to embodiments illustrated in the accompanying drawings, wherein.

DESCRIPTION OF THE PREFERRED EMBODIMENTS

Figure 1:
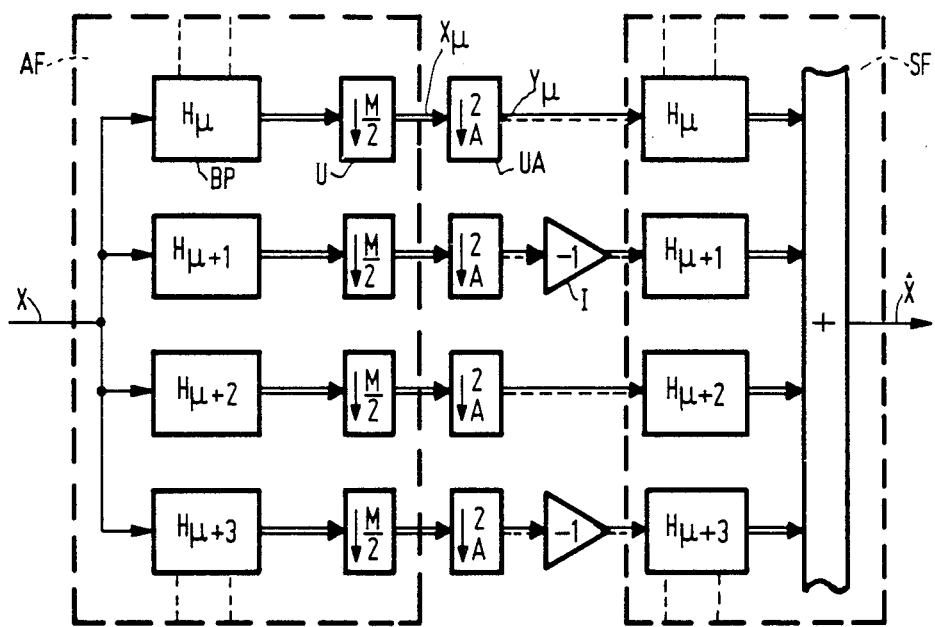
FIG. 1 shows a first embodiment.

The digital analysing and synthesizing filter bank according to the invention can be applied advantageously in the sub-band coders of a digital radio transmission system.

The sub-band encoding of prior art digital radio transmission systems is based on a tree structure of cascaded QMF filters (see "Multirate digital signal processing" by Ronald E. Crochiere, Prentice-Hall). This method has the advantage—as already explained—that the aliasing distortions caused in the encoder because of sampling rate reduction are compensated for by the interpolation in the decoder filtering operation.

The disadvantage of this method is that—because of the cascade arrangement—the signal delay time becomes approximately a factor of 2 longer as required on the basis of the bandwidth. On the other hand using what are commonly referred to as polyphase network or PPN filter banks (PPN=Poly-Phase Network) as disclosed in the above-mentioned German patent application DE-OS 31 18 473, the shortest signal delay times can be realized.

The QMF method using the quadrature mirror condition as known for half-band filters can be employed in the PPN filter bank. Taking account of the embodiment-specific delays, the digital analysing and synthesizing filter bank according to the invention, having M=8 channels, has a delay of only 10 ms. The computational time required for encoding and decoding the sub-band signals must be added to this delay. When the number of channels is doubled, this value must also be doubled. In this respect the sub-band coder including the digital analysing and synthesizing filter bank according to the invention has a marked advantage over the various RELP coder variants (RELP=Residual Excited Linear Prediction).

The adaptive assigning of bits to the individual bands is effected in a way similar to the method disclosed in the above mentioned German patent application DE-OS 31 18 473. The first bit is assigned to the channel having the maximum power. Subsequently the power of this channel is divided by four and the next bit is again assigned to the channel which then has the highest power. This method is repeated until all the bits have been allocated. The actual assignment need not be reported to the decoder, as it can be determined from the transmitted additional information. A total of four processors (for example integrated signal processors NEC µPD 7720) are required for the encoder and decoder together.

In consideration of the acoustic constraints on the reduction of interference, only those algorithms are used for speech coding purposes which are to a very large extent insensitive to acoustical background noise. This requires a certain degree of transparency as regards the interferences (that is to say the background noise is co-transmitted). It is possible to improve the disturbed speech signal prior to encoding by means of adaptive filtering. A method suitable for reducing certain types of interferences is disclosed in the above-mentioned German Patent application DE-OS 31 18 473. The method disclosed therein is based on sub-band decomposition of the disturbed signal and adaptive processing of the sub-band signals. By means of this method it is in particular possible to efficiently suppress periodic interferences, whilst for noise-type interferences a reduced residual noise remains. Advantageously, the digital filter arrangement known from said patent application is combined with a sub-band coder. Only one common filter bank is then required for both functions.

The analysing filter bank AF splits the applied input signal x with the aid of parallel-arranged, complex bandpass filters BP into complex sub-band signals which are reduced in sampling rate in a subsequent arrangement U. As is shown in FIG. 1, for this operation a polyphase network filter bank AF (PPN-filter bank) having a sampling rate reduction by a factor $r=M/2$ is preferably used. The first stage of the sampling rate reduction is extensively described in the above-mentioned German patent application DE-OS 31 18 473. The M complex sub-band signals $x_\mu$ then occurring have complex values at each sampling instant (i) in accordance with the equation $$x_\mu(i \cdot M/2) = a_\mu(i) + j \cdot b_\mu(i), \text{ where } \mu = 0, 1 \ldots, M-1 \quad (1)$$

In the second stage of the sampling rate reduction, a further reduction of the data rate by a factor of 2 is effected by means of the sampling rate reducer UA to derive signals $Y\mu(i)$ in accordance with the following equation:

$$y_\mu(i) = 0.5 \cdot [x_\mu(i) + (-1)^i \cdot x_\mu^*(i)] = \begin{cases} a_\mu(i) & i = \text{even} \\ j \cdot b_\mu(i) & i = \text{odd} \end{cases} \quad (2)$$

where $x^*_\mu(i)$ designates the conjugate complex values of the sequence $x_\mu(i)$. In accordance with the invention, the further sampling rate reduction of the M complex sub-band signals $x_\mu$ is accomplished by staggered sampling rate reduction (complex sampling rate reduction) of the real and the imaginary components $a_\mu(i)$ and $b_\mu(i)$ of the sub-band signals $x_\mu$.

As alternately only the real component or the imaginary component is required, the data rate for transmission or storage and/or processing corresponds to the data rate at a maximum sampling rate reduction by the factor $r=M$.

The second stage of the sampling rate reduction by the factor of 2 can directly be taken account of in the implementation of the analysing filter bank AF in that the DFT processor is structured such that it only calculates the values $a_\mu(i)$ and $b_\mu(i)$ required at the instants in question.

As is shown in FIG. 1, at the input of a synthesizing filter bank SF the sign of every second channel is inverted by means of an inverter arrangement I, that is to say all the channels having odd index numbers. Also for the synthesis a PPN-filter bank having an interpolation by a factor $r=M/2$ is used. Also in this case the fact that at each instant i the sub-band signals $y_\mu(i)$ assume either only real or only imaginary values can be advantageously used.

The relationships between the frequency spectra of the input and output signals are known from the paper "A Unified Approach to Digital Polyphase Filter Banks" by Dr. P. Vary and G. Wackersreuther (published in AEÜ, Vol. 37, (1983), pages 29 to 34). Taking the above-mentioned dual-stage sampling rate reduction into account, it can be demonstrated that for the output signal X the following equation holds:

$$X(\Omega) = \sum_{\mu=0}^{M-1} (-1)^\mu \cdot [H(\Omega - 2\pi \mu/M)]^2 \cdot X(\Omega) \quad (3)$$

where $\Omega = 2\pi f/F_a$ and $H(\Omega)$ is the transfer function of the prototype low-pass filter of the filter bank.

A condition for the validity of the above equation is that the cut-off limit of the prototype low-pass filter of the filter bank satisfies the condition given by the following equation:

$$|H(\Omega)| < \delta \text{ for } 2\pi/M \leq \Omega \leq \pi \quad (4)$$

and the stop-band attenuation 20 log ($\delta$) is sufficiently high. In this respect "sufficiently high" means that the signal components subject to this stop-band attenuation can be disregarded. This condition is satisfied in practice, a 50% spectral overlap of adjacent filter bank channels being permissible in accordance with equation (4). The interfering aliasing distortions occurring at the maximum sampling rate reduction and being located between every pair of adjacent channels are compensated for during the synthesizing filtering operation.

Figure 3A:
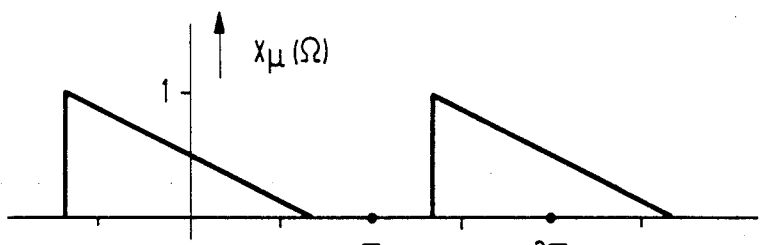
FIGS. 3a and 3b show the sub-band signals in the frequency domain occurring in the first embodiment as shown in FIG. 1 and FIGS. 4a and 4b show the sub-band signals in the frequency domain occurring in the second embodiment as shown in FIG. 2.
Figure 3B:
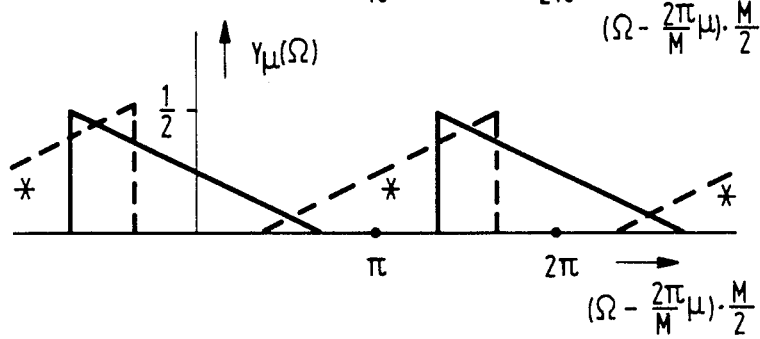

The second stage of the sampling rate reduction in accordance with the invention will now be described in greater detail with reference to the sub-band signals represented in FIG. 3. The spectrum of the complex sub-band signal $x_\mu(i)$ shown in FIG. 3a is converted to the spectrum shown in FIG. 3b for the for a sampling rate reducing operation defined by equation (2). The mirror-image, conjugate complex frequency spectrum which is shifted spectrally by modulation in accordance with $(-1)^\mu$ (see equation (2)) by an amount equal to the standardized frequency $\pi$, corresponds to the conjugate complex time signal $x^*_\mu(i)$. Because of the mirror-imaging and shifting a compensation of the interfering aliasing components can be effected during the synthesizing filtering operation by alternating sign inversion for every second sub-band signal. Since by mirror-imaging an interaction occurs between adjacent filters of the analysing and synthesizing filter banks AF and SF, a compensation mechanism becomes effective between two adjacent channels.

Figure 2:
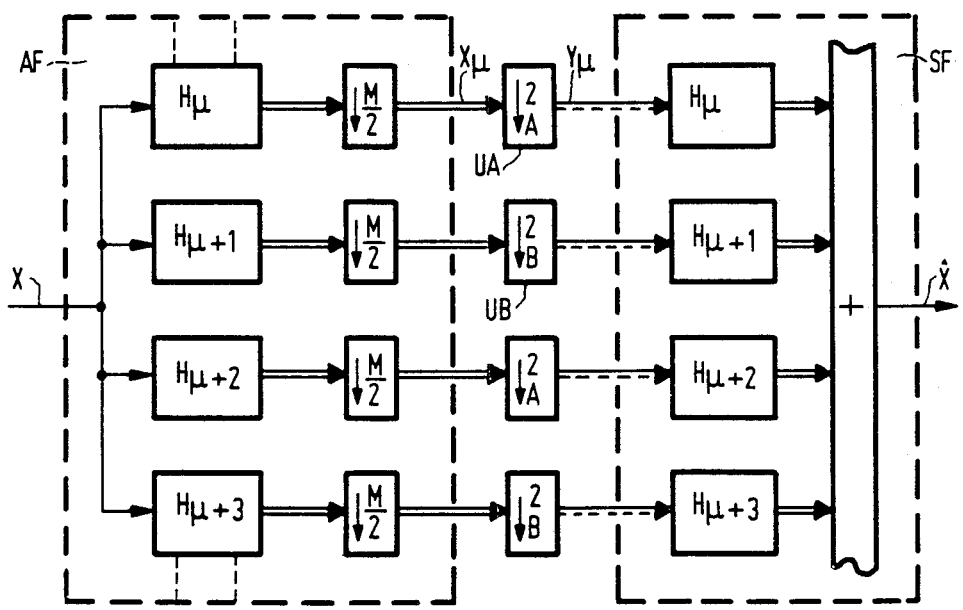
FIG. 2 shows a second embodiment of the digital analysing and synthesizing filter bank according to the invention.

FIG. 2 shows a further embodiment of the digital analysing and synthesizing filter bank according to the invention. Likewise as in FIG. 1, the PPN-filter bank having a sampling rate reduction by a factor $r=M/2$ is used for the analysing filter bank AF. Consequently, as in the first embodiment, the analysing filter bank disclosed in German patent application DE-OS 31 18 473 is used for the first stage of the sampling rate reduction. For the additional sampling rate reduction in the second stage, the sub-band signals $x_\mu$ of adjacent channels are complementary reduced in sampling rate by a factor of 2, as defined in the following equation:

$$y_\mu(i) = \begin{cases} a_\mu(i) & i = \text{even } \mu = 0, 2, 4, \ldots \\ j \cdot b_\mu(i) & i = \text{odd } \mu = 1, 3, 5, \ldots \end{cases} \quad (5a)$$

With the object of illustrating in FIG. 2 the computation of the sub-band signals $y_\mu(i)$ in accordance with equation (5a), the sampling rate reducer is denoted by the letters UA (and likewise by the letters UB in the case of the equation (5b)).

In addition, the sampling rate reduction of the sub-band signals which is complementary to the sampling rate reduction of the sub-band signals defined by the equation (5a) is effected in accordance with the equation $$y_\mu(i) = 0.5 \cdot [x_\mu(i) - (-1)^i \cdot x^*_\mu(i)] = \quad (5b)$$

$$\begin{cases} j \cdot b_\mu(i) & i = \text{even } \mu = 0, 2, 4, \ldots \\ a_\mu(i) & i = \text{odd } \mu = 1, 3, 5, \ldots \end{cases}$$

The different treatment of the channels (sub-band signals) indexed as odd or even may alternatively be interchanged.

Compared with the embodiment of FIG. 1, no alternating sign reversal of adjacent sub-band signals is required for the synthesis. On the conditions mentioned in the foregoing as regards the prototype low-pass filter, the input-output relation of the following equation holds for this case $$X(\Omega) = \sum_{\mu=0}^{M-1} [H(\Omega - 2\pi \mu/M)]^2 \cdot X(\Omega) \quad (6)$$

Appropriate methods for calculating prototype low-pass filters which, when their frequency response is superposed in accordance with the equations (3) or (6), produce a constant sum frequency response of the analysing and synthesizing filter bank are known from literature ("Digital Signal Processing", by A. V. Oppenheim, Prentice-Hall, 1975).

Figure 4A:
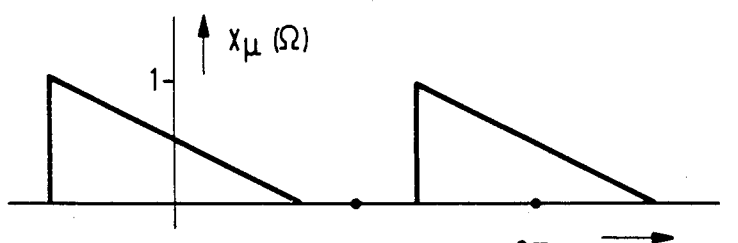
Figure 4B:
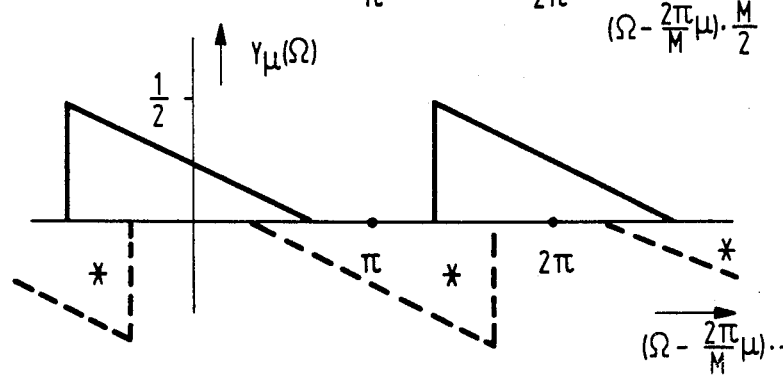

The sampling rate reduction defined in equation (5b) which results in the complex sub-band signals $y_\mu(i)$ is shown in FIG. 4. Comparing FIG. 4b with FIG. 3b shows that the mirror-image repetition of the spectrum resulting from the sampling rate reduction has a negative sign (see also equation (5b) and equation (2)).

Because of this sign inversion, the alternating sign inversion of the sub-band signals $y_\mu(i)$ can be omitted, the effective sum frequency response being obtained in accordance with equation (6).

What is claimed is:

1. A digital analyzing and synthesizing filter bank comprising: an analyzing filter bank which divides a digital input signal (x) having an input sampling rate into M complex sub-band signals ($x_\mu$) with simultaneous sampling rate reduction by a factor M/2, and a synthesizing filter bank which by interpolation increases the sampling rate of the M complex sub-band signals ($x_\mu$) to derive interpolated sub-band signals ($y_\mu$) at the initital sampling rate and adds together the interpolated sub-band signals ($y_\mu$) to produce an output signal at such sampling rate; characterized in that the analyzing filter band effects a further reduction of the sampling rate of the M complex sub-band signals ($x_\mu$) by staggered complex sampling rate reduction of the real and imaginary components $a_\mu(i)$, $b_\mu(i)$ of said complex sub-band signals ($x_\mu$).

2. A filter bank as claimed in claim 1, characterized in that the complex sampling rate reduction of the real and imaginary components of the M complex sub-band signals ($x_\mu$) is effected in accordance with $$y_\mu(i) = 0.5 \cdot [x_\mu(i) + (-1)^i \cdot x^*_\mu(i)] = \begin{cases} a_\mu(i); & i = \text{even} \\ j \cdot b_\mu(i); & i = \text{odd} \end{cases}$$

where $x^*_\mu(i)$ designates the conjugate complex components of the signal $x_\mu(i)$, and further characterized in that the sign of every second successive complex sub-band signal $y_\mu(i)$ thus obtained is inverted.

3. A filter bank as claimed in claim 1, characterized in that the complex sampling rate reduction of the real and imaginary components of the M complex sub-band signals ($x_\mu$) having even index numbers (i) is effected in accordance with $$y_\mu(i) = 0.5 \cdot [x_\mu(i) + (-1)^i \cdot x^*_\mu(i)] = \begin{cases} a_\mu(i); & i = \text{even} \\ j \cdot b_\mu(i); & i = \text{odd} \end{cases}$$

where $x^*_\mu$ designates the conjugate complex components of the signals $x_\mu(i)$, and further characterized in that the complex sampling rate reduction of the real and imaginary components of the M complex sub-band signals ($x_\mu$) having odd index numbers (i) is effected in accordance with $$y_\mu(i) = 0.5 \cdot [x_\mu(i) - (-1)^i \cdot x_\mu^*(i)] = \begin{cases} j \cdot b_\mu(i); & i = \text{even} \\ a_\mu(i); & i = \text{odd}. \end{cases}$$

4. A filter bank as claimed in claim 1, characterized in that the complex sampling rate reduction of the real and imaginary components of the M complex sub-band signals ($x_\mu$) is effected in accordance with $$y_\mu(i) = 0.5 \cdot [x_\mu(i) - (-1)^i \cdot x_\mu^*(i)] = \begin{cases} j \cdot b_\mu(i); & i = \text{even} \\ a_\mu(i); & i = \text{odd} \end{cases}$$

and that the sign of every second successive complex sub-band signal $y_\mu(i)$ thus obtained is inverted.

* * * * *